United States Patent
Nittou

(10) Patent No.: US 8,192,055 B2
(45) Date of Patent: Jun. 5, 2012

(54) BACKLIGHT DEVICE AND DISPLAY DEVICE USING THE SAME

(75) Inventor: Eiji Nittou, Mie (JP)

(73) Assignee: Sharp Kabushiki Kaisha, Osaka (JP)

( * ) Notice: Subject to any disclaimer, the term of this patent is extended or adjusted under 35 U.S.C. 154(b) by 390 days.

(21) Appl. No.: 12/441,070

(22) PCT Filed: Apr. 11, 2007

(86) PCT No.: PCT/JP2007/058002
§ 371 (c)(1),
(2), (4) Date: Mar. 12, 2009

(87) PCT Pub. No.: WO2008/032460
PCT Pub. Date: Mar. 20, 2008

(65) Prior Publication Data
US 2009/0316432 A1 Dec. 24, 2009

(30) Foreign Application Priority Data
Sep. 13, 2006 (JP) .................................. 2006-248523

(51) Int. Cl.
*F21V 8/00* (2006.01)

(52) U.S. Cl. ....... 362/294; 362/97.3; 362/612; 362/231; 362/249.02

(58) Field of Classification Search ................. 362/97.1, 362/97.2, 97.3
See application file for complete search history.

(56) References Cited

U.S. PATENT DOCUMENTS

| | | | |
|---|---|---|---|
| 7,448,785 B2 | 11/2008 | Suzuki | |
| 7,488,104 B2 | 2/2009 | Hamada et al. | |
| 7,513,661 B2 | 4/2009 | Hamada et al. | |
| 2002/0149314 A1 | 10/2002 | Takahashi et al. | |
| 2003/0156416 A1* | 8/2003 | Stopa et al. | 362/294 |
| 2006/0082732 A1 | 4/2006 | Miwa et al. | |
| 2006/0187660 A1* | 8/2006 | Liu | 362/294 |
| 2007/0103908 A1 | 5/2007 | Tabito et al. | |

FOREIGN PATENT DOCUMENTS

| | | |
|---|---|---|
| JP | 2001-266606 A | 9/2001 |
| JP | 2001-291406 A | 10/2001 |
| JP | 2002-314146 A | 10/2002 |
| JP | 2005-353507 A | 12/2005 |
| JP | 2006-64733 A | 3/2006 |
| JP | 2006-139245 A2 | 6/2006 |
| JP | 2006-216244 A | 8/2006 |
| JP | 2006-236951 A | 9/2006 |
| WO | WO 2005/114045 A1 | 12/2005 |

* cited by examiner

*Primary Examiner* — Laura Tso

(74) *Attorney, Agent, or Firm* — Birch, Stewart, Kolasch & Birch, LLP

(57) ABSTRACT

A backlight device is provided with a substrate whereupon a plurality of light emitting diodes are arranged, and a lower side chassis (heat dissipating unit) where heat generated by the light emitting diodes is transferred from the substrate and dissipated to the outside. An amount of heat generated by each light emitting diode is measured in advance, and in accordance with the measurement results of the amounts of generated heat, an arrangement position on the substrate is determined and corresponding light emitting diodes are arranged.

20 Claims, 4 Drawing Sheets

BACKLIGHT DEVICE AND DISPLAY DEVICE USING THE SAME

TECHNICAL FIELD

The present invention relates to a backlight device, and in particular to a backlight device having light emitting diodes as a light source and a display device using the same.

BACKGROUND ART

Recently, for example, a liquid crystal display device has been widely used in liquid crystal televisions, monitors and mobile phones as a flat panel display having features such as being thinner and lighter in comparison to a conventional cathode ray tube. Such a liquid crystal display device includes a backlight device that emits light and a liquid crystal panel that displays a desired image by acting as a shutter against light from a light source provided in the backlight device.

Furthermore, as the aforementioned backlight device, an edge light type or a direct type backlight device is provided in which a linear light source constituted of a cold-cathode tube or a hot-cathode tube is disposed on a side of or below the liquid crystal panel. However, the cold-cathode tube such as described above and the like contain mercury, resulting in difficulty in, for example, recycling the cold-cathode tube to be disposed of. In view of this, a backlight device whose light source is light emitting diodes (LEDs) in which mercury is not used has been developed and practically used.

Additionally, in the conventional backlight device such as described above, white light is obtained usually by using a white LED or by being provided with three colors of LEDs that emit red (R), green (G) and blue (B) light and mixing these three colors of light, and the device emits the white light toward the liquid crystal panel as illumination light.

However, in the LED such as described above, in general, the luminous efficiency declines as the ambient temperature rises. Consequently, the balance between the amounts of red, green, and blue light is lost. As a result, luminous quality may decline because white light cannot be obtained appropriately, or luminance irregularity occurs.

In view of this, in conventional backlight devices, there have been proposals, as recited in JP2005-353507A, JP2006-49098A and JP2006-64733A for example, to dissipate heat generated by LEDs to the outside by providing a heat dissipation mechanism using a heat dissipating plate or an elastic sheet having heat conductivity etc. In addition, the conventional backlight device has been considered to be able to prevent a decline in luminous efficiency and a decline in luminous quality by suppressing a rise in the ambient temperature caused by heat from LEDs.

DISCLOSURE OF INVENTION

Problem to be Solved by the Invention

However, the conventional backlight device described above was unable to efficiently dissipate heat generated by variations in LEDs. Thus, the conventional backlight device was unable to sufficiently suppress a rise in the ambient temperature caused by heat from LEDs, resulting in a problem in which improvement of luminous efficiency and luminous quality was difficult to achieve.

Specifically, the conventional backlight device collectively dissipates heat from a plurality of LEDs via the heat dissipation mechanism by being provided with the heat dissipating plate and the like on a substrate on which a plurality of LEDs are arranged.

However, regarding RGB LEDs, the amount of heat generated for each color is different from one another, and the heat dissipation performed for some LEDs may not be sufficient. Moreover, regarding LEDs, compared to a conventional electric-discharge tube such as a cold-cathode tube, variation in an amount of heat generated by each product is great, and even if the LEDs are the same products having the same color, an amount of heat generated by each product was sometimes significantly different due to quality or properties of its material. As a result, the conventional backlight device was unable to efficiently dissipate heat generated by LEDs, and there were some cases in which luminous efficiency and luminous quality were difficult to improve.

In addition, in order to improve the luminous efficiency and luminous quality of the conventional backlight device, it was sometimes necessary to needlessly increase heat dissipation capability of the heat dissipation mechanism, and there were cases in which it was unable to prevent a structure of the backlight device from being complicated and upsized.

In view of the above circumstances, it is an object of the present invention to provide a simple-structured backlight device that can effectively dissipate heat from LEDs and improve luminous efficiency and luminous quality and a display device using the same.

Means for Solving Problem

In order to achieve the above object, a backlight device according to the present invention is a backlight device provided with a plurality of LEDs that includes a substrate on which the LEDs have been arranged and a heat dissipating unit to which heat generated by the LEDs is transferred from the substrate, and that dissipates the heat to the outside. An amount of heat generated by each of the plurality of LEDs is measured in advance, and an arrangement position of each of the plurality of LEDs on the substrate is determined in accordance with the measurement results of the amounts of generated heat.

In the backlight device configured as described above, the amount of heat generated by each of the plurality of LEDs is measured, and the LEDs are arranged on the substrate in accordance with the measurement results. Thus the LEDs are arranged on the substrate so that a portion of the substrate where the temperature will be relatively high and a portion of the substrate where the temperature will be relatively low are understood in advance. As a result of this, unlike the above conventional example, the heat dissipating unit is capable of dissipating heat of a portion of the substrate where the temperature will be high with priority, thus, being able to effectively dissipate heat from the LEDs. This enables obtaining a simple-structured backlight device that can sufficiently suppress an increase in ambient temperature caused by heat from the LEDs and can improve luminous efficiency and luminous quality.

Furthermore, in the aforementioned backlight device, it is preferable that a metallic material having heat conductivity is used in the substrate.

In this case, the substrate can efficiently transfer heat generated by the LEDs to the heat dissipating unit and more effectively dissipate heat from the LEDs.

Furthermore, in the aforementioned backlight device, the plurality of LEDs may include a plurality of types of LEDs whose luminous colors are different from each other.

In this case, compared to a case of using a white LED that emits white light, color purity of the corresponding luminous color described above can be improved, and a backlight device having superior luminous quality can be easily obtained.

Furthermore, in the aforementioned backlight device, it is preferable that the plurality of LEDs include red, green and blue LEDs that emit red, green and blue light respectively.

In this case, color purity of each of the red, green, and blue luminous colors can be improved, and a backlight device having much superior luminous quality can be easily obtained.

Furthermore, the aforementioned backlight device may include a heat transfer member that has been disposed between the substrate and the heat dissipating unit and transfers heat generated by the LEDs from the substrate to the heat dissipating unit, and a disposition location of the heat transfer member between the substrate and the heat dissipating unit may be determined in accordance with the measurement results of the amounts of heat generated by the LEDs.

In this case, the disposition location of the heat transfer member is appropriately determined in accordance with the amount of heat generated by each LED. Consequently, heat conduction from the substrate to the heat dissipating unit can be more efficiently performed, and heat dissipation effect produced by the heat dissipating unit can be easily improved.

Furthermore, in the aforementioned backlight device, it is preferable that a casing that holds the LEDs is used in the heat dissipating unit, and a screw that connects the substrate and the casing together is used as the heat transfer member.

In this case, since the heat transfer member also serves as the aforementioned screw, the number of parts of the backlight device can be reduced, and a simple-structured backlight device can be easily obtained.

Furthermore, in the aforementioned backlight device, the heat dissipating unit may include a heat sink provided to the casing.

In this case, heat dissipation effect produced by the heat dissipating unit can be more easily improved.

Furthermore, in the aforementioned backlight device, it is preferable that the plurality of LEDs have been arranged on the substrate along a prescribed direction at prescribed intervals, and the heat transfer member has been disposed between the substrate and the heat dissipating unit so as to be close to at least a red LED that emits red light among a red LED and a green LED that emits green light out of the plurality of LEDs.

In this case, among the plurality of LEDs, the red LED and green LED generate a relatively large amount of heat, and between these two, the heat transfer member is disposed close to at least the red LED. Accordingly, the heat transfer member can more efficiently perform heat conduction, and the heat dissipation effect produced by the heat dissipating unit can be more easily improved.

Furthermore, in the aforementioned backlight device, the heat transfer member may be disposed between the red LED and the green LED that have been arranged on the substrate so as to be adjacent in the prescribed direction.

In this case, the number of the heat transfer member disposed can be reduced, and the number of parts of the backlight device can be easily reduced.

Furthermore, in the aforementioned backlight device, it is preferable that among the plurality of LEDs, a blue LED that emits blue light has been arranged so as to be adjacent to a red LED that emits red light or a green LED that emits green light.

In this case, the blue LED that generates a relatively small amount of heat is arranged on the substrate adjacent to the red LED or the green LED that generates a relatively large amount of heat. Thus, an uneven temperature distribution on the substrate can be suppressed and the heat dissipation effect produced by the heat dissipating unit can be more easily improved.

Furthermore, in the aforementioned backlight device, it is preferable that among the plurality of LEDs, a blue LED that emits blue light has been arranged so as to be adjacent to a red LED that emits red light or a green LED that emits green light, and a red LED and a green LED have been arranged so as not to be adjacent to each other.

In this case, the blue LED that generates a relatively small amount of heat is arranged on the substrate adjacent to the red LED or the green LED that generates a relatively large amount of heat. Moreover, the red LED and the green LED are arranged so that they are not adjacent to each other. Thus, an uneven temperature distribution on the substrate can be more easily suppressed, and heat dissipation effect produced by the heat dissipating unit can be more easily improved.

Furthermore, a display device of the present invention is a display device including a display unit, and light from any one of the aforementioned backlight devices is irradiated onto the display unit.

In the display device configured as described above, light irradiated onto the display unit is generated by the simple-structured backlight device that can effectively dissipate heat from the LEDs and can improve luminous efficiency and luminous quality. Therefore, even when the display unit is designed to have high luminance and a large screen, the compact display device having superior display performance can be easily obtained.

Effects of the Invention

The present invention enables providing a simple-structured backlight device that can effectively dissipate heat from LEDs and improve luminous efficiency and luminous quality and a display device using the same.

BRIEF DESCRIPTION OF DRAWINGS

FIG. 3A is an enlarged perspective view of an attachment section of LEDs, and FIG. 3B shows an example of a disposition of screws and LEDs.

FIG. 4A is an enlarged perspective view of an attachment section of LEDs, and FIG. 4B shows an example of a disposition of LEDs.

DESCRIPTION OF THE INVENTION

Hereinafter, preferred embodiments of a backlight device of the present invention and a display device using the same will be described with reference to drawings. Note that, the following describes exemplary cases where the present invention is applied to a transmissive liquid crystal display device.

First Embodiment

Figure 1:
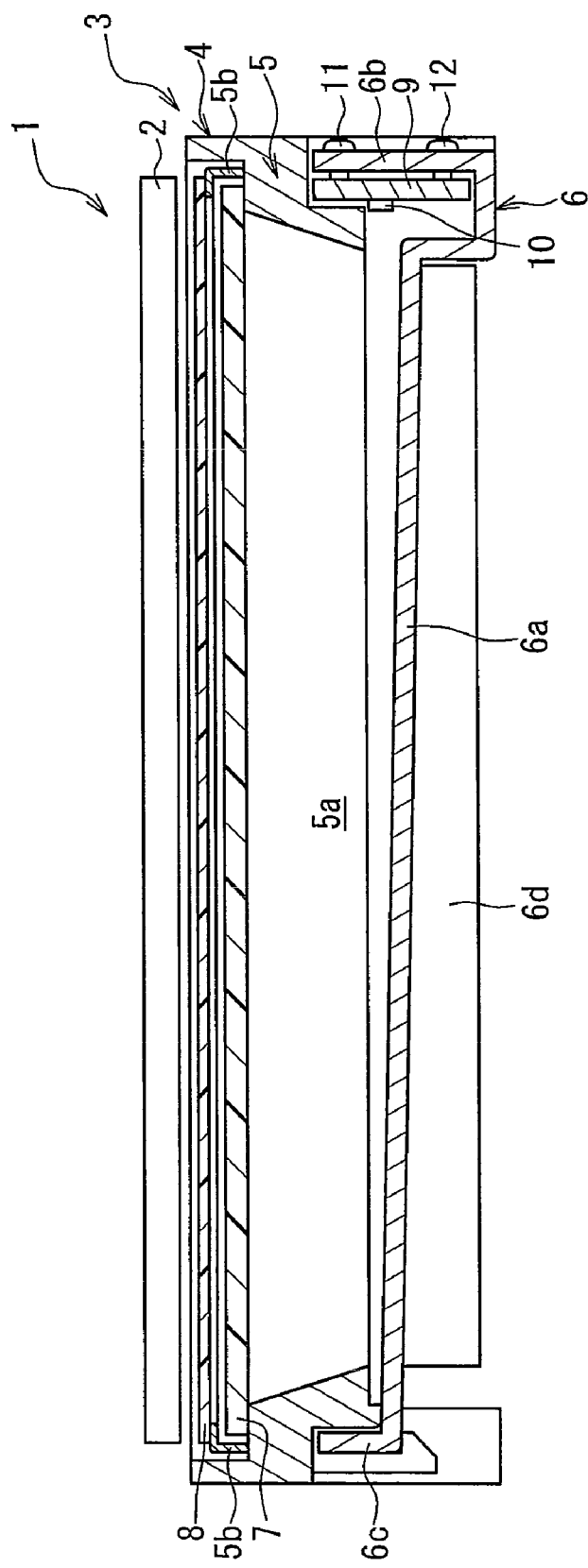
FIG. 1 is a cross-sectional view showing a configuration of relevant parts of a backlight device and a liquid crystal display device according to a first embodiment of the present invention.

FIG. 1 is a cross-sectional view showing a configuration of relevant parts of a backlight device and a liquid crystal display device according to a first embodiment of the present invention. In FIG. 1, a liquid crystal display device 1 of the present embodiment is provided with a liquid crystal panel 2 as a display unit that is arranged so that the upside of FIG. 1 is a viewing side (display side) and a backlight device 3 of the present invention that is disposed on the non-display side of the liquid crystal panel 2 (lower side of FIG. 1) and generates illumination light to illuminate the liquid crystal panel 2.

The liquid crystal panel 2 includes a liquid crystal layer and a drive circuit that drives the liquid crystal layer in units of pixels (not shown). In the liquid crystal panel 2, using the aforementioned illumination light from a light emitting surface of the backlight device 3 disposed facing the liquid crystal panel 2, a desired image is formed on a display surface of the liquid crystal panel 2. Furthermore, the liquid crystal panel 2 and the backlight device 3 are put together by a bezel (not shown) so as to be integrated as the transmissive liquid crystal display device 1.

The backlight device 3 is provided with a casing 4 and a plurality of LEDs 10 that are aligned in a direction perpendicular to the plane of FIG. 1 and contained in the casing 4. In addition, the backlight device 3 is configured to be an edge light type device in which the plurality of LEDs 10 are aligned parallel to one of the four sides surrounding the light emitting surface.

The casing 4 is configured so as to have a function as a heat dissipating unit that dissipates heat generated by the LEDs 10 and is equipped with a higher side chassis 5 arranged on a side closer to the liquid crystal panel 2 and a lower side chassis 6 fixed to the higher side chassis 5 on a side opposite to the liquid crystal panel 2.

A metallic material that has high heat conductivity, such as aluminum, copper or iron, is preferably used as the metallic material of the higher side chassis 5 and lower side chassis 6 so that they can efficiently dissipate heat from the LEDs 10 to the outside (described in detail below).

Specifically, the higher side chassis 5 is a support frame body in which a space 5a is formed. Along with supporting a diffusion plate 7 by a step portion formed so as to surround the light emitting surface, the higher side chassis 5 is configured so as to support an optical sheet 8 between the liquid crystal panel 2 and the diffusion plate 7 by a support frame 5b arranged on the step portion.

In addition, the optical sheet 8 includes, for example, a polarizing sheet, a prism (light condensation) sheet, and a diffusion sheet, and these sheets have appropriate functions such as increasing the luminance of the illumination light from the backlight device 3 so as to improve display performance of the liquid crystal panel 2.

Note that, in addition to the above description, for example, when the optical sheet 8 contains the diffusion sheet, arrangement of the diffusion plate 7 may be omitted.

The lower side chassis 6 is equipped with a bottom 6a disposed facing the diffusion plate 7 and sides 6a and 6c provided to stand upright toward the top side of FIG. 1 on the right end and left end of the bottom 6a in FIG. 1 in order to block the space 5a between the diffusion plate 7 and the lower side chassis 6.

Furthermore, the bottom 6a of the lower side chassis 6 is inclined so that the left end of the bottom 6a is closer to the diffusion plate 7 than the right end. That is, the bottom 6a is configured to guide light from the LEDs 10 to the left side of FIG. 1 and to appropriately send light to the diffusion plate 7 side by reflection.

Note that a surface of the bottom 6a on the diffusion plate 7 side has a color such as white or silver that has a superior light reflectance. Also, the space formed between the higher side chassis 5 containing the space 5a and the lower side chassis 6 is configured to function as a color mixing space in which the colored light emitted by later-described red, green and blue LEDs that emit red (R), green (G) and blue (B) light respectively is mixed to obtain white light.

Moreover, the lower side chassis 6 constitutes a substantial casing that holds the LEDs 10, and a substrate 9 on which the LEDs 10 are arranged is installed parallel to the side 6b via screws 11 and 12.

The screws 11 and 12 are not only connection members that connect the substrate 9 and the lower side chassis 6 to each other, but also heat transfer members that transfer heat generated by the LEDs 10 from the substrate 9 to the lower side chassis 6. Moreover, disposition locations of these screws 11 and 12 are determined as described below in detail in order to enable effective dissipation of heat from the LEDs 10.

Figure 2:
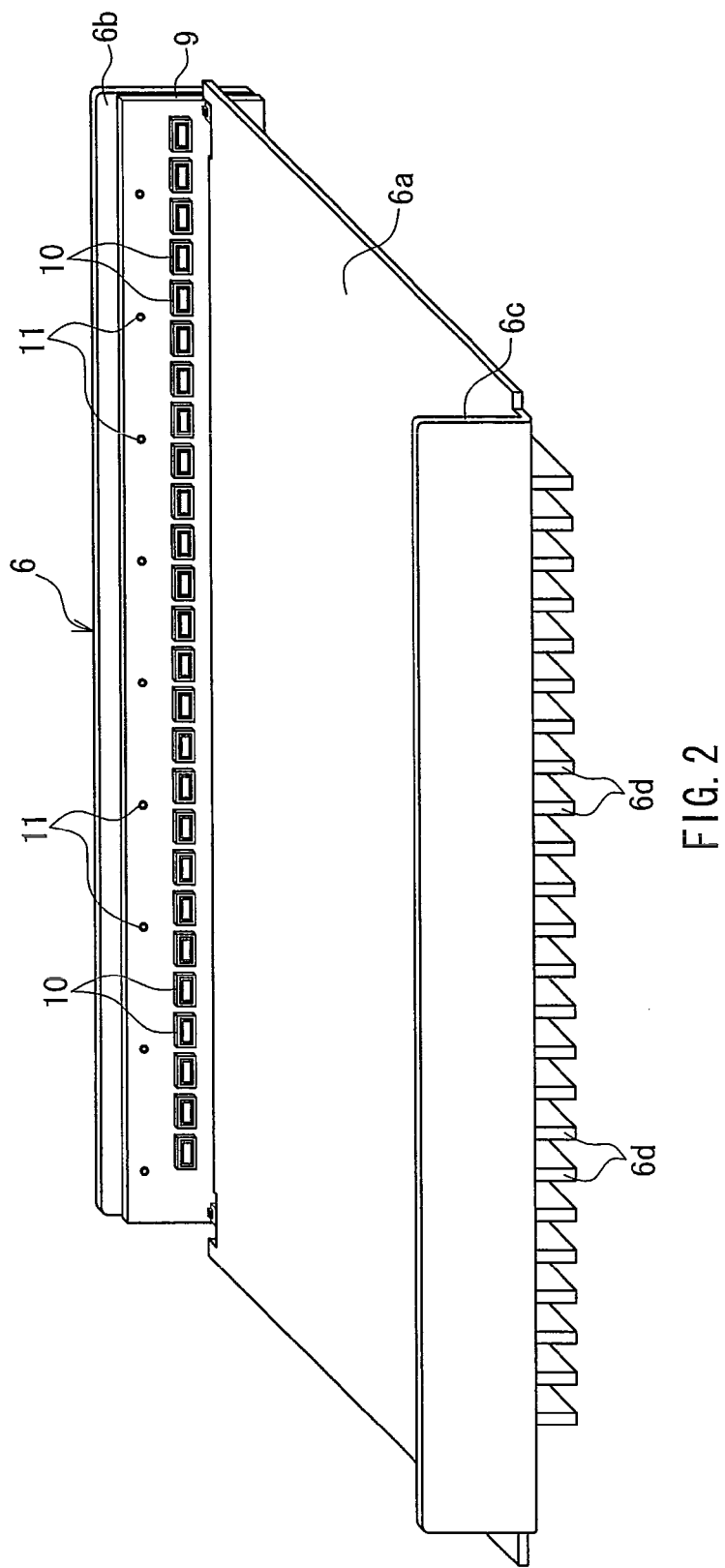
FIG. 2 is a perspective view showing a lower side chassis and a substrate on which LEDs are arranged that are shown in FIG. 1.

With additional reference to FIG. 2, the plurality of LEDs 10 are aligned on the substrate 9 in a line at a predetermined pitch measurement. Also, a metallic material having high heat conductivity such as aluminum is used in the substrate 9, and heat from the LEDs 10 can be efficiently transferred to the lower side chassis 6 via the screws 11 and 12. As a result of this, in the present embodiment, the casing 4 is configured to more effectively dissipate heat from the LEDs 10.

Furthermore, in order for the lower side chassis 6 to function as a heat sink provided to the casing 4, a plurality of fins 6d are formed on the non-display side of the bottom 6a, and the lower side chassis 6 is configured to more easily improve heat dissipation effect produced by the casing 4.

Figure 3A:
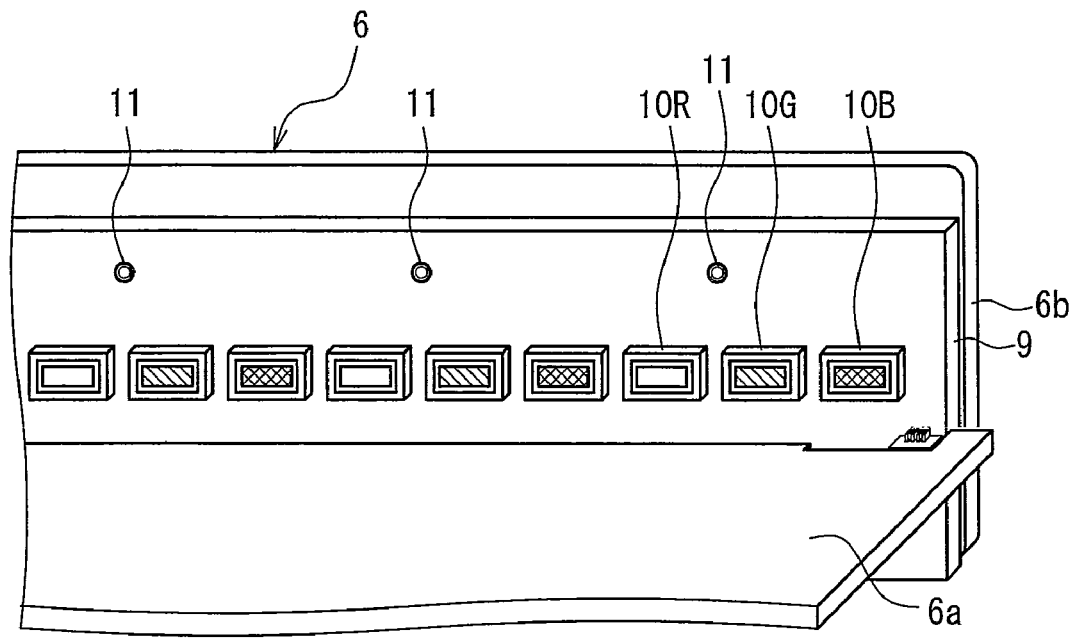
FIGS. 3A and 3B show configurations of relevant parts of the aforementioned backlight device.

Moreover, the plurality of LEDs 10, as described above, include LEDs 10R, 10G and 10B that emit red, green and blue light respectively. In addition, these LEDs 10R, 10G, and 10B are shown in FIG. 3A as a non-hatched portion, a hatched portion, and a cross-hatched portion respectively (in a similar fashion in FIG. 4A that is described later).

Furthermore, the backlight device 3 is configured so that the red, green and blue light is mixed to make white light inside the color mixing space that is formed between the higher side chassis 5 and the lower side chassis 6, and the white light is emitted as illumination light from the light emitting surface. As a result, the backlight device 3 can improve the luminous quality of illumination light and can cause illumination light suitable for full color images to incident upon the liquid crystal panel 2. Accordingly, display quality of the liquid crystal panel 2 can be easily improved.

Additionally, regarding the plurality of LEDs 10, the installed number of, types of and sizes of the RGB LEDs 10R, 10G and 10B are selected in accordance with the size of the liquid crystal panel 2, luminance that the liquid crystal panel 2 requires, display performance such as display quality and the like.

Moreover, an amount of heat generated by each of the RGB LEDs 10R, 10G and 10B is measured in advance, and an arrangement position on the substrate 9 is determined in accordance with the measurement results. That is, the LEDs 10 are lit under the same measurement conditions such as ambient temperature (e.g. 25 degrees C. (normal temperature)) and a drive condition under which the backlight device 3 is normally driven. Then, an increase in temperature is measured using a temperature sensor such as a thermography or a radiation thermometer, and an amount of generated heat is obtained based on the measured increase in temperature.

Specifically, regarding the RGB LEDs 10R, 10G and 10B, it is understood that the amount of heat generated by the red LED 10R, the green LED 10G, and the blue LED 10B is largest in the stated order.

Figure 3B:
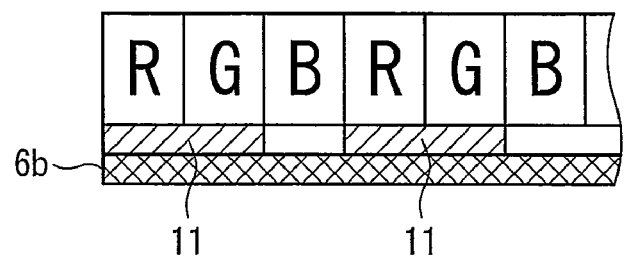

Thus, as illustrated in FIG. 3B, the red and green LEDs 10R and 10G that generate a relatively large amount of heat are arranged adjacent to each other on the substrate 9, and the screw 11 is disposed so as to be close to both the red LED 10R and green LED 10G. Moreover, the screw 12 is also disposed in a similar position to that of the screw 11. Consequently, the screws 11 and 12 can transfer, with priority, heat from the red LED 10R and green LED 10G that generate a relatively large amount of heat from the substrate 9 to the side 6b.

In the present embodiment, with the configuration described above, the amount of heat generated by each of the plurality of LEDs 10 is measured in advance. Furthermore, in accordance with the measurement results of amounts of generated heat, corresponding LEDs 10 are arranged on the substrate 9. That is, in the present embodiment, the LEDs 10 are arranged on the substrate 9 so that a portion of the substrate 9 where the temperature will be relatively high and a portion of the substrate 9 where the temperature will be relatively low are understood in advance. As a result of this, in the present embodiment, unlike the above conventional example, the casing (heat dissipating unit) 4 is capable of dissipating heat of a portion of the substrate 9 where the temperature will be high with priority, thus being able to effectively dissipate heat from the LEDs 10. This enables obtaining a simple-structured backlight device 3 that can sufficiently suppress an increase in ambient temperature caused by heat from the LEDs 10 and can improve luminous efficiency and luminous quality.

In addition, as described above, in the present embodiment, since the backlight device 3 has a simple structure and has superior luminous efficiency and luminous quality, even when the liquid crystal panel (display unit) 2 is designed to have high luminance and a large screen by increasing the number of the LEDs 10 installed, the compact liquid crystal display device 1 having superior display performance can be easily obtained.

Moreover, in the present embodiment, the screws (heat transfer members) 11 and 12 that transfer heat generated by the LEDs 10 from the substrate 9 to the casing 4 are arranged between the casing 4 and the substrate 9, and disposition locations between the casing 4 and the substrate 9 of these screws 11 and 12 are determined in accordance with the measurement results of the amount of heat generated by the LEDs 10. Accordingly, disposition locations of the screws 11 and 12 are appropriately determined in accordance with an amount of heat generated by the LEDs 10. As a result of this, heat conduction from the substrate 9 to the casing 4 can be performed more efficiently, and the heat dissipation effect produced by the casing 4 can be easily improved.

Note that, although the above description describes, as illustrated in FIG. 3B, the case where the screw (heat transfer member) 11 is disposed so as to be close to both of the red LED 10R and green LED 10G that generate a relatively large amount of heat, the present embodiment is not limited to this. The heat transfer member may be disposed close to only the red LED 10R that generates the largest amount of heat of the RGB LEDs 10R, 10G and 10B. That is, it is sufficient to dispose the heat transfer member between the substrate 9 and the side 6b of the lower side chassis 6 in a position close to at least the red LED 10R among the red and green LEDs.

However, as illustrated in FIG. 3A, the case where the red LED 10R and green LED 10G that generate a relatively large amount of heat are disposed adjacent in the arrangement direction (prescribed direction) on the substrate 9, and the screw (heat transfer member) 11 is disposed between these LEDs 10R and 10G is preferable in that the number of heat transfer members disposed can be reduced and accordingly, the number of parts in the backlight device 3 can be easily reduced.

Second Embodiment

Figure 4A:
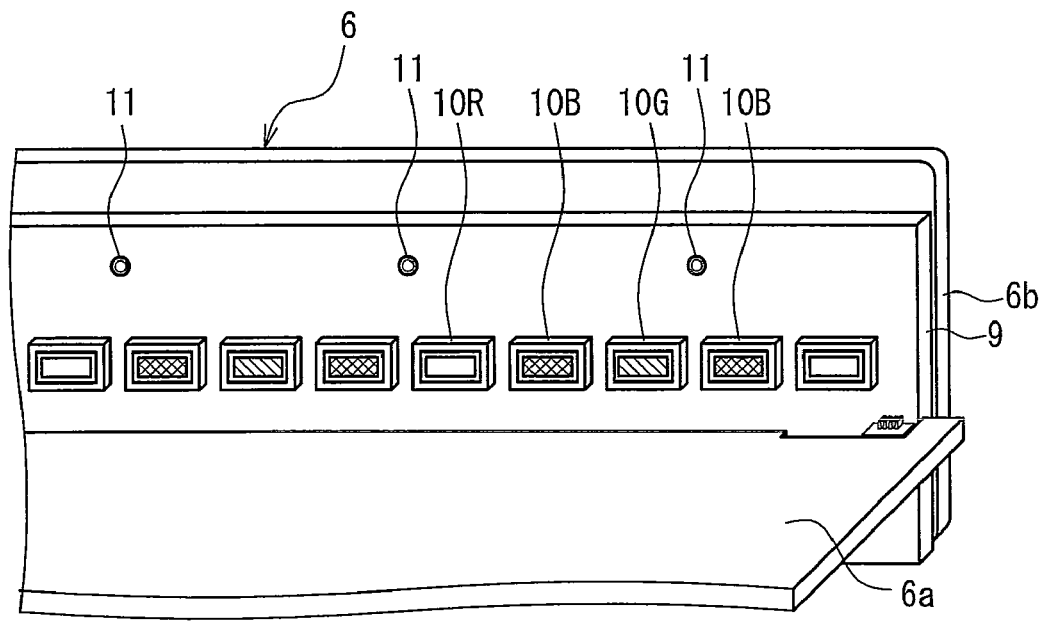
FIGS. 4A and 4B show a configuration of relevant parts of a backlight device according to a second embodiment of the present invention.
Figure 4B:

FIGS. 4A and 4B show a configuration of relevant parts of a backlight device according to a second embodiment of the present invention. FIG. 4A is an enlarged perspective view of an attachment section of LEDs, and FIG. 4B shows an example of a disposition of LEDs. In FIGS. 4A and 4B, a main difference between the present embodiment and the aforementioned first embodiment is that a plurality of LEDs are arranged on a substrate so that a blue LED is arranged adjacent to a red LED or a green LED. Note that the same reference numerals are given to elements common to those in the aforementioned first embodiment, so redundant description will be omitted.

Namely, as shown in FIGS. 4A and 4B, the blue LED 10B is arranged adjacent to the red LED 10R or the green LED 10G on the substrate 9 of the present embodiment. That is, the blue LED 10B is arranged between the red LED 10R and the green LED 10G. Moreover, the red LED 10R and the green LED 10G are arranged so that they are not adjacent to each other.

Also, in the present embodiment, similarly to the first embodiment, the substrate 9 is connected to the side 6b of the lower side chassis 6 via the screws 11 and 12, and heat generated by the LEDs 10 is transferred from the substrate 9 to the lower side chassis 6 (casing 4) via the screws 11 and 12.

According to the above configuration, in the present embodiment, heat from the LEDs 10 can be effectively dissipated similarly to the first embodiment. Thus, similarly to the first embodiment, the present embodiment enables obtaining a simple-structured backlight device 3 that can improve luminous efficiency and luminous quality and a liquid crystal display device 1 using the same.

Moreover, since the blue LED 10B that generates a relatively small amount of heat is arranged on the substrate 9 of the present embodiment so as to be adjacent to the red LED 10R or the green LED 10G that generates a relatively large amount of heat, compared to the first embodiment, an uneven temperature distribution on the substrate 9 can be suppressed. As a result of this, the present embodiment enables more easily improving the heat dissipation effect produced by the casing 4.

That is, in the present embodiment, an arrangement area of the red LED 10R or the green LED 10G that causes a relatively high increase in temperature and an arrangement area of the blue LED 10B that causes a relatively small increase in temperature are adjacent on the substrate 9, thereby enabling suppressing an increase in temperature on the substrate 9. Furthermore, in the present embodiment, the red LED 10R and the green LED 10G are disposed so that they are not adjacent to each other, thereby enabling more easily suppressing an uneven temperature distribution on the substrate 9. As a result of this, the present embodiment enables more easily improving heat dissipation effect produced by the casing 4.

Note that, the aforementioned embodiments are all illustrative and not limiting. The technical scope of the present invention is defined by the scope of claims for patent. All modifications within a scope equivalent to configuration therein are also included in the technical scope of the present invention.

For example, although the case where the present invention is applied to a transmissive liquid crystal display device is described above, the backlight device of the present invention is not limited to this. The present invention can also be applied to various display devices provided with a non-light emitting display unit that displays information such as images and characters by using light from a light source. Specifically, the backlight device of the present invention can be suitably used for a semi-transmissive liquid crystal display device or a projection display device.

In addition to the aforementioned description, the present invention can be suitably used as a backlight device of a view box that irradiates light onto an X-ray photograph, a light box that irradiates light onto a photographic negative and the like so as to make visual recognition easier, a light emitting device that lights up a sign, an advertisement put up, e.g., on a wall in stations and the like.

Moreover, in the aforementioned description, the case where red, green and blue LEDs that emit corresponding RGB light are used is described. However, in a backlight device provided with a substrate on which a plurality of LEDs are arranged and a heat dissipating unit that transfers heat generated by LEDs from the substrate to the outside, the present invention is not limited in any way as long as an amount of heat generated by each LED is measured in advance, an arrangement position on the substrate is determined in accordance with the measurement results of the amounts of generated heat, and corresponding LEDs are arranged.

Specifically, the present invention can be applied to a backlight device that includes only white LEDs that emit white light instead of three colors of RGB LEDs as a light source or a backlight device that uses at least two separate colors of LEDs, e.g. yellow and blue LEDs whose light can be mixed to obtain white light, for its light source.

However, as in the aforementioned embodiments, the case where red, green and blue LEDs are used is preferable in that the color purity of each of the red, green, and blue luminous colors contained in illumination light can be improved, luminous quality of the backlight device can be easily improved, and a display device with high display quality (display performance) can be easily obtained.

In addition, although the case where the present invention is applied to the edge light type backlight device in which a plurality of LEDs are aligned parallel to one of the four sides surrounding the light emitting surface of the backlight device is described above, the present invention is not limited to this. The present invention can also be applied to an edge light type backlight device in which a plurality of LEDs are respectively aligned parallel to each of the two or more of the four sides or a direct type backlight device in which a plurality of LEDs are aligned below the light emitting surface.

Furthermore, unlike the aforementioned embodiments, the aforementioned edge light type backlight device in which a plurality of LEDs are respectively aligned parallel to each of the two or more of the four sides or the direct type backlight device can be provided with a plurality of substrates, and a plurality of LEDs can also be arranged on each substrate.

Moreover, in addition to the aforementioned description, the present invention can also be applied to an edge light type backlight device in which two or more lines of a plurality of LEDs are aligned parallel to one of the four sides.

Furthermore, although the case where the space formed between the higher side chassis and lower side chassis of the casing is used as the color mixing space is described above, the present invention is not limited to this. The present invention can also be applied to a case where a light guide body is used. That is, the present invention can be applied to a backlight device that is composed using transparent synthetic resin such as acrylic resin and emits white illumination light by causing the interior of a light guide body whose cross section is rectangular or wedge-shaped that has an introduction surface to which light from opposing LEDs is introduced to function as the color mixing space.

Moreover, although the case where the screw is used as the heat transfer member is described above, the heat transfer member of the present invention is not limited in any way as long as the heat transfer member is disposed between the substrate and the heat dissipating unit and can transfer heat generated by LEDs from the substrate to the heat dissipating unit.

Specifically, for example, synthetic resin to which heat conductivity that conducts heat in the prescribed direction has been given can be used as the heat transfer member. Additionally, in the case of the direct type backlight device, a reflecting plate that reflects light on the light emitting surface (liquid crystal panel) of the backlight device can also serve as the heat transfer member.

Additionally, although the configuration in which the screw (heat transfer member) is interposed to transfer heat from the substrate to the heat dissipating unit is described above, the present invention is not limited to this. Depending on amounts of heat generated by LEDs and heat dissipation capability of the heat dissipating unit etc., the heat dissipating unit can also dissipate heat without interposing a heat transfer member by directly connecting the substrate on which LEDs are arranged to the side (heat dissipating unit) of the lower side chassis and directly transferring heat generated by LEDs from the substrate to the heat dissipating unit.

However, the case of interposing the screw as the heat transfer member as in the aforementioned embodiments is preferable due to enabling the screw to also serve as the heat transfer member, and easily obtaining a simple-structured backlight device while reducing the number of parts of the backlight device. Furthermore, the case where the screw is interposed is more preferable in that an adjustment operation such as a replacement operation of LEDs can be easily performed since the substrate and the heat dissipating unit can be attached together and separated.

Moreover, although the case where the lower side chassis (casing) on which the heat sink is arrange is used as the heat dissipating unit is described above, the heat dissipating unit of the present invention is not limited to this. The heat dissipating unit can include a heat dissipation mechanism that can perform forced-cooling of heat from LEDs such as a fan, or a heat pipe in which a cooling medium is circulated.

INDUSTRIAL APPLICABILITY

Due to using a simple-structured backlight device that can effectively dissipate heat from LEDs and can improve luminous efficiency and luminous quality, a backlight device and a display device using the same pertaining to the present invention are effective as a backlight device that can irradiate light with high luminance onto a display unit having a large screen and as a display device including the display unit.

The invention claimed is:

1. A backlight device provided with a plurality of light emitting diodes, the back light device comprising:
   a substrate on which the light emitting diodes have been arranged; and
   a heat dissipating unit to which heat generated by the light emitting diodes is transferred from the substrate, and that dissipates the heat to the outside, wherein an amount of heat generated by each of the plurality of light emitting diodes is measured in advance, and an arrangement position of each of the plurality of light emitting diodes on the substrate is determined in accordance with the measurement results of the amounts of generated heat, and wherein among the plurality of light emitting diodes, a blue light emitting diode that emits blue light has been arranged so as to be adjacent to a red light emitting diode that emits red light or a green light emitting diode that emits green light.

2. The backlight device according to claim 1, wherein a metallic material having heat conductivity is used in the substrate.

3. The backlight device according to claim 1, wherein the plurality of light emitting diodes include a plurality of types of light emitting diodes whose luminous colors are different from each other.

4. The backlight device according to claim 1, wherein the plurality of light emitting diodes include red, green and blue light emitting diodes that emit red, green and blue light respectively.

5. The backlight device according to claim 1, further comprising
a heat transfer member that has been disposed between the substrate and the heat dissipating unit and transfers heat generated by the light emitting diodes from the substrate to the heat dissipating unit,
wherein, a disposition location of the heat transfer member between the substrate and the heat dissipating unit has been determined in accordance with the measurement results of the amounts of heat generated by the light emitting diodes.

6. The backlight device according to claim 5, wherein a casing that holds the light emitting diodes is used in the heat dissipating unit, and a screw that connects the substrate and the casing together is used as the heat transfer member.

7. The backlight device according to claim 6, wherein the heat dissipating unit includes a heat sink provided to the casing.

8. The backlight device according to claim 5, wherein the plurality of light emitting diodes have been arranged on the substrate along a prescribed direction at prescribed intervals, and
the heat transfer member has been disposed between the substrate and the heat dissipating unit so as to be close to at least a red light emitting diode that emits red light among a red light emitting diode and a green light emitting diode that emits green light out of the plurality of light emitting diodes.

9. The backlight device according to claim 8, wherein the heat transfer member has been disposed between the red light emitting diode and the green light emitting diode that have been arranged on the substrate so as to be adjacent in the prescribed direction.

10. The backlight device according to claim 1, wherein
a red light emitting diode and a green light emitting diode have been arranged so as not to be adjacent to each other.

11. A display device comprising a display unit, wherein light from the backlight device according to claim 1 is irradiated onto the display unit.

12. The backlight device according to claim 2, wherein the plurality of light emitting diodes include a plurality of types of light emitting diodes whose luminous colors are different from each other.

13. The backlight device according to claim 2, wherein the plurality of light emitting diodes include red, green and blue light emitting diodes that emit red, green and blue light respectively.

14. The backlight device according to claim 3, wherein the plurality of light emitting diodes include red, green and blue light emitting diodes that emit red, green and blue light respectively.

15. The backlight device according to claim 2, further comprising a heat transfer member that has been disposed between the substrate and the heat dissipating unit and transfers heat generated by the light emitting diodes from the substrate to the heat dissipating unit,
wherein, a disposition location of the heat transfer member between the substrate and the heat dissipating unit has been determined in accordance with the measurement results of the amounts of heat generated by the light emitting diodes.

16. The backlight device according to claim 3, further comprising a heat transfer member that has been disposed between the substrate and the heat dissipating unit and transfers heat generated by the light emitting diodes from the substrate to the heat dissipating unit,
wherein, a disposition location of the heat transfer member between the substrate and the heat dissipating unit has been determined in accordance with the measurement results of the amounts of heat generated by the light emitting diodes.

17. The backlight device according to claim 4, further comprising a heat transfer member that has been disposed between the substrate and the heat dissipating unit and transfers heat generated by the light emitting diodes from the substrate to the heat dissipating unit,
wherein, a disposition location of the heat transfer member between the substrate and the heat dissipating unit has been determined in accordance with the measurement results of the amounts of heat generated by the light emitting diodes.

18. The backlight device according to claim 6, wherein the plurality of light emitting diodes have been arranged on the substrate along a prescribed direction at prescribed intervals, and
the heat transfer member has been disposed between the substrate and the heat dissipating unit so as to be close to at least a red light emitting diode that emits red light among a red light emitting diode and a green light emitting diode that emits green light out of the plurality of light emitting diodes.

19. The backlight device according to claim 7, wherein the plurality of light emitting diodes have been arranged on the substrate along a prescribed direction at prescribed intervals, and
the heat transfer member has been disposed between the substrate and the heat dissipating unit so as to be close to at least a red light emitting diode that emits red light among a red light emitting diode and a green light emitting diode that emits green light out of the plurality of light emitting diodes.

20. A backlight device provided with a plurality of light emitting diodes, the back light device comprising:
a substrate on which the light emitting diodes are arranged along a prescribed direction at prescribed intervals;
a heat dissipating unit to which heat generated by the light emitting diodes is transferred from the substrate, and that dissipates the heat to the outside; and
a heat transfer member disposed between the substrate and the heat dissipating unit so as to be close to at least a red light emitting diode that emits red light among a red light emitting diode and a green light emitting diode that emits green light out of the plurality of light emitting diodes, and that transfers heat generated by the light emitting diodes from the substrate to the heat dissipating unit.

* * * * *